(12) United States Patent
Tanaka

(10) Patent No.: US 7,944,021 B2
(45) Date of Patent: May 17, 2011

(54) SEMICONDUCTOR DEVICE WITH SUPPRESSED HUMP CHARACTERISTIC

(75) Inventor: Kouji Tanaka, Kanagawa (JP)

(73) Assignee: Renesas Electronics Corporation, Kawasaki-shi, Kanagawa (JP)

( * ) Notice: Subject to any disclaimer, the term of this patent is extended or adjusted under 35 U.S.C. 154(b) by 0 days.

(21) Appl. No.: 12/461,113

(22) Filed: Jul. 31, 2009

(65) Prior Publication Data
US 2010/0032772 A1    Feb. 11, 2010

(30) Foreign Application Priority Data
Aug. 7, 2008   (JP) ................................. 2008-203878

(51) Int. Cl.
*H01L 21/70*    (2006.01)
*H01L 29/786*   (2006.01)
*H01L 29/76*    (2006.01)

(52) U.S. Cl. . 257/547; 257/288; 257/349; 257/E29.007; 257/E21.548

(58) Field of Classification Search ............ 257/288, 257/349, 547, E29.007, E21.548
See application file for complete search history.

(56) References Cited

U.S. PATENT DOCUMENTS

| 6,690,071 B2 * | 2/2004 | Sambonsugi et al. ........ 257/376 |
| 2002/0050614 A1 * | 5/2002 | Unnikrishnan ............... 257/347 |
| 2004/0079995 A1 * | 4/2004 | Bryant et al. ................. 257/347 |

FOREIGN PATENT DOCUMENTS

| JP | 2001-148478 | | 5/2001 |
| JP | 2004-288873 | | 10/2004 |
| JP | 2006222329 A | * | 8/2006 |
| KR | 2005010226 A | * | 1/2005 |
| KR | 2009073969 A | * | 7/2009 |

* cited by examiner

*Primary Examiner* — Teresa M Arroyo
(74) *Attorney, Agent, or Firm* — McGinn IP Law Group, PLLC

(57) ABSTRACT

A semiconductor device includes an element isolation film formed on a semiconductor substrate surface of one conductivity type, a gate electrode having one pair of end portions located on a boundary between an element isolation film and an element forming region, a source region and a drain region of a reverse conductivity type arranged to sandwich a region immediately below a gate electrode, and an impurity diffusion region of the one conductivity type formed in the element forming region. The source region is separated from a region on a boundary side between the element isolation film and the element forming region in the region immediately below the gate electrode in the element forming region. In the impurity diffusion region, a portion adjacent to the region on the boundary side is arranged between the source region and the element isolation film, and is in contact with the source region and the region on the boundary side. The impurity diffusion region is not arranged between the drain region and the element isolation film.

6 Claims, 8 Drawing Sheets

US 7,944,021 B2

SEMICONDUCTOR DEVICE WITH SUPPRESSED HUMP CHARACTERISTIC

This application is based on Japanese patent application NO. 2008-203878, the content of which is incorporated hereinto by reference.

BACKGROUND

1. Technical Field

The present invention relates to a semiconductor device.

2. Related Art

An element isolation technique called STI (Shallow Trench Isolation) is used with an increase in integration density of a conventional semiconductor device.

In the element isolation technique, a trench is formed in a surface of a semiconductor substrate, and the trench is filled with an element isolation film to isolate a plurality of element forming regions from each other.

However, in the semiconductor device using such an element isolation technique, it is known that a hump characteristic is exhibited, as shown in FIG. 6. FIG. 6 is a diagram showing a relationship between a gate electrode and a drain current.

An impurity in the element forming region is diffused in the element isolation film, and an impurity concentration is lowered in the element forming region close to the element isolation film. A gate oxide film on a boundary between the element forming region and the element isolation film becomes thin. Due to this, a threshold voltage of a channel region close to the element isolation film is lower than a threshold voltage of an original channel. For this reason, a parasitic transistor is formed. In the semiconductor device, it can be regarded that two transistors which are equivalently different in threshold voltage from each other. In this manner, it is considered that a hump characteristic as shown in FIG. 6 is generated. The reference symbol A in FIG. 6 denotes a curve showing a relationship between a gate voltage and a drain current in a main transistor, the reference symbol B denotes a curve showing a relationship between a gate voltage and a drain current in a parasitic transistor, and the reference symbol C denotes a curve obtained by combining the curves A and B.

In order to suppress generation of the hump characteristic, a semiconductor device 800 as shown in FIG. 7 is known (see Japanese Patent Application Laid-Open (JP-A) No. 2004-288873), for example.

In the semiconductor device 800, an end portion of a gate electrode 801 is configured with a first gate line portion 801A and a second gate line portion 801B. A region 802 sandwiched between the first gate line portion 801A and the second gate line portion 801B is used as a p-type semiconductor region. In the semiconductor device 800, a source region 803 and a drain region 804 are n-type semiconductor regions.

In the semiconductor device 800, a channel region is disconnected by the p-type semiconductor region 802, and a parasitic transistor can be prevented from being formed.

The semiconductor device 900 shown in FIG. 8 is also proposed (see JP-A No. 2001-148478).

In the semiconductor device 900, a first high-resistance region 903 is formed between a source region 901 and an element isolation film 902, and a second high-resistance region 905 is formed between a drain region 904 and an element isolation film 902. In this case, for example, the source region 901 and the drain region 904 are n$^+$-type diffusion layers, and the first high-resistance region 903 and the second high-resistance region 905 are n$^-$-type diffusion layers or p$^-$-type diffusion layers.

The first high-resistance region 903 and the second high-resistance region 905 are formed so that the channel region and the boundary between the element isolation film 902 and the element forming region do not overlap. Accordingly, hump characteristic generation can be suppressed.

However, in the technique of JP-A No. 2004-288873, since an end portion of the gate electrode 801 is configured with the first gate line portion 801A and the second gate line portion 801B, the shape of the gate electrode 801 is complicated.

In the technique of JP-A No. 2001-148478, when each of the first high-resistance region 903 and the second high-resistance region 905 is formed by an n$^-$-type diffusion layer, an inter-drain-source current may flow through a channel region of a parasitic transistor disadvantageously.

On the other hand, the first high-resistance region 903 and the second high-resistance region 905 are configured by a p$^-$-type diffusion layer, the following problems may occur.

Since the first high-resistance region 903 is arranged adjacent to the source region 901, a contact metal film may be provided over the first high-resistance region 903 and the source region 901, and the same voltage as that in the source region 901 is applied to the first high-resistance region 903.

Similarly, a contact metal film is formed over the second high-resistance region 905 and the drain region 904, the same voltage as in the drain region 904 is applied to the second high-resistance region 905.

For this reason, a potential of the first high-resistance region 903 is equal to a potential of the source region 901, and a potential of the second high-resistance region 905 is equal to a potential of the drain region 904. Although a substrate potential can be made equal to the potential of the source region 901, since the substrate potential is different from the potential of the drain region 904, a leakage current may flow over the second high-resistance region 905 formed on the drain region 904 side and a p-type semiconductor substrate.

In JP-A No. 2001-148478, the high-resistance regions 903 and 905 are arranged on the source region 901 side and the drain region 904 side, respectively, to reduce an area of an element forming region. For this reason, in the configuration of JP-A No. 2001-148478, the high-resistance regions 903 and 905 are necessarily arranged on the source region 901 side and the drain region 904 side, respectively.

SUMMARY

According to the present invention, there is provided a semiconductor device including: an element isolation film formed on a semiconductor layer surface of one conductivity type; a gate electrode which is arranged on an element forming region partitioned by the element isolation film and which has one pair of end portions located on a boundary between the element isolation film and the element forming region; a source region and a drain region of a reverse conductivity type formed in the element forming region and arranged to sandwich a region immediately below the gate electrode; and an impurity diffusion region of the one conductivity type formed in the element forming region, wherein the source region is arranged to be separated from a region on a boundary side between the element isolation region and the element forming region in the region immediately below the gate electrode in the element forming region, the impurity diffusion region of the one conductivity type is in contact with the source region and the region on the boundary side of the region immediately below the gate electrode, a portion adjacent to the region on the boundary side is located between the source region and the element isolation film, and the impurity diffusion region of the one conductivity type is not arranged between the drain region and the element isolation film.

According to the present invention, the source region is arranged to be separated from the region on the boundary side between the element isolation film and the element forming region in the region immediately below the gate element in the element forming region.

In the impurity diffusion region of the one conductivity type, a portion adjacent to a region on the boundary side in the region immediately below the gate electrode is arranged between the source region and the element isolation film. The impurity diffusion region of the one conductivity type is in contact with the source region and the region on the boundary side of the region immediately below the gate electrode.

Therefore, according to the present invention, due to the impurity diffusion region of the one conductivity type, the region on the boundary side between the element isolation film and the element forming region in the region immediately below the gate electrode is not in direct contact with the source region. In this manner, the region on the boundary side between the element isolation film and the element forming region in the region immediately below the gate electrode may be prevented from being a channel region, and parasitic transistor generation may be suppressed. For this reason, a hump characteristic occurring may be suppressed.

In this manner, in the present invention, the impurity diffusion region of the one conductivity type may be arranged between the source region and the element isolation film in the region adjacent to the region on the boundary side of the region immediately below the gate electrode, and may be arranged to be in contact with the source region and the region on the boundary side of the region immediately below the gate electrode. Unlike in the technique of JP-A No. 2004-288873, the impurity diffusion region of the one conductivity type need not be arranged between divided end portions of the gate electrode. For this reason, the shape of the gate electrode may be prevented from being complicated.

Furthermore, in the present invention, the impurity diffusion region of the one conductivity type is not arranged between the drain region and the element isolation film. In this manner, as in the conventional technique, a leakage current may be prevented from being generated between the impurity diffusion region of the one conductivity type and the semiconductor layer, and thereby performance of the semiconductor device may be improved.

According to the present invention, there is provided a semiconductor device which may suppress hump characteristic occurring and may improve performance of the semiconductor device.

BRIEF DESCRIPTION OF THE DRAWINGS

The above and other objects, advantages and features of the patent invention will be more apparent from the following description of certain preferred embodiments taken in conjunction with the accompanying drawings, in which.

DETAILED DESCRIPTION

The invention will be now described herein with reference to illustrative embodiments. Those skilled in the art will recognize that many alternative embodiments can be accomplished using the teachings of the present invention and that the invention is not limited to the embodiments illustrated for explanatory purposes.

An embodiment of the present invention will be described below with reference to the accompanying drawings.

Figure 1:
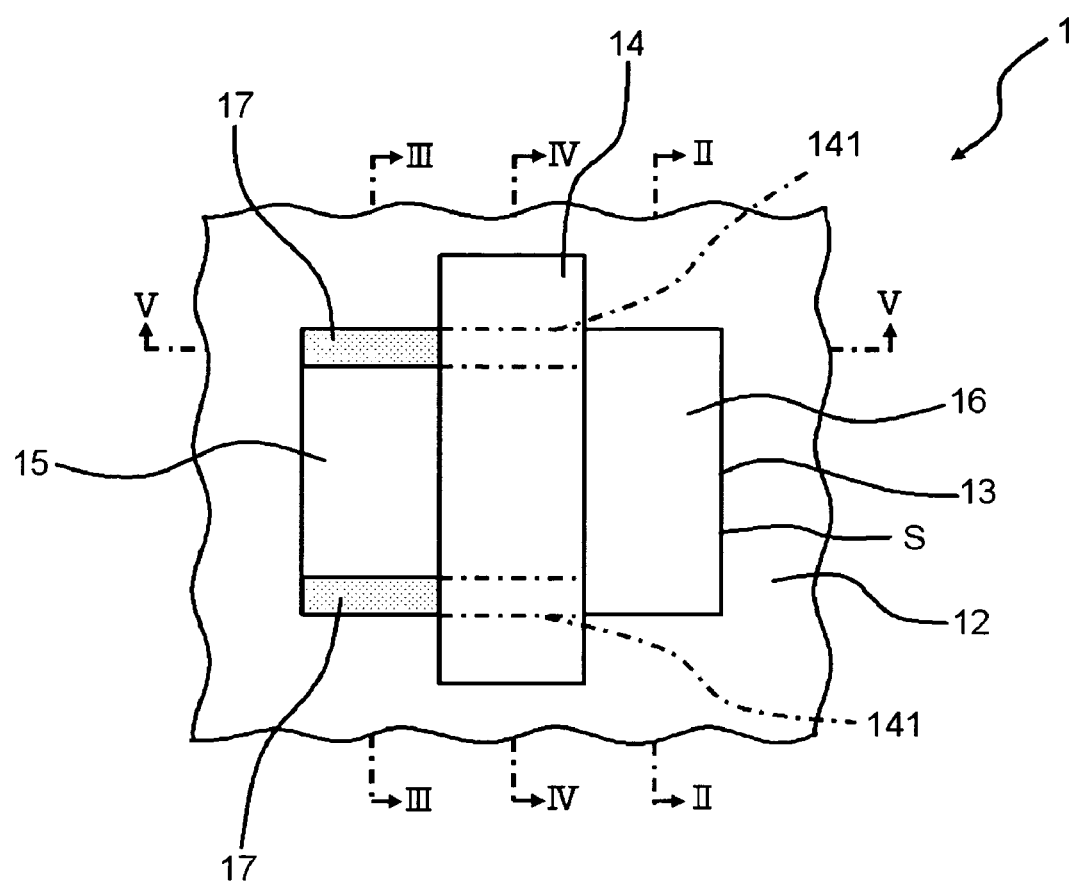
FIG. 1 is a plan view of a semiconductor device according to one embodiment of the present invention.
Figure 2:
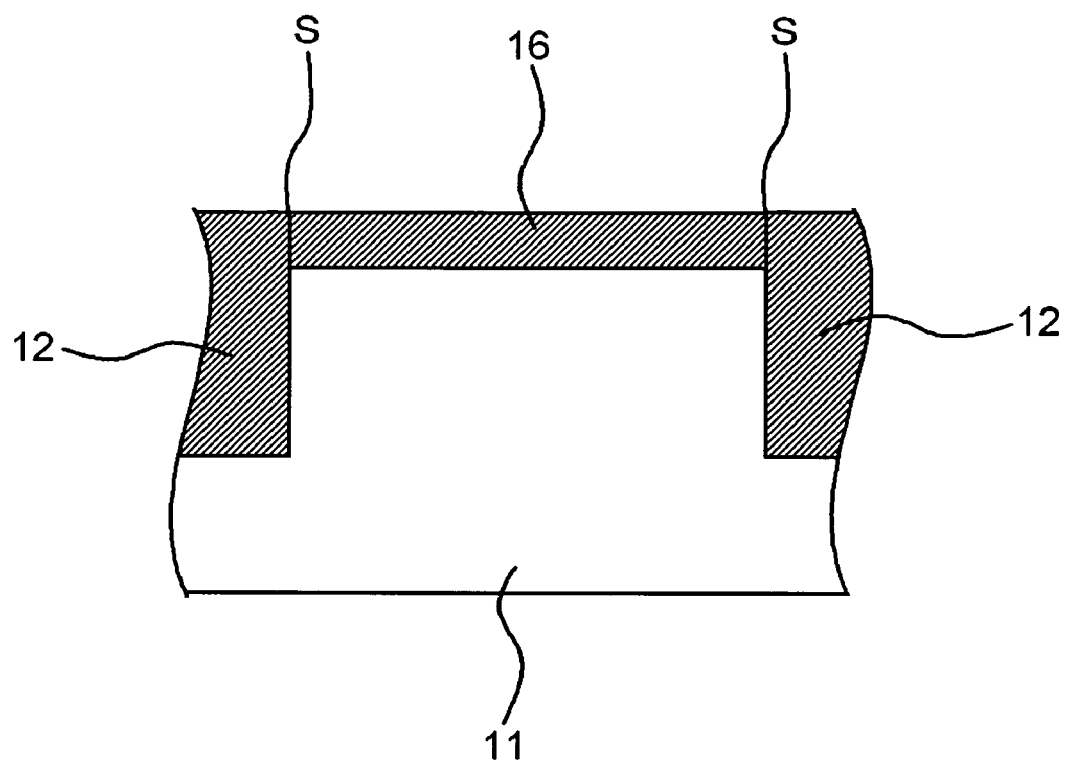
FIG. 2 is a sectional view in a II-II direction in FIG. 1.
Figure 3:
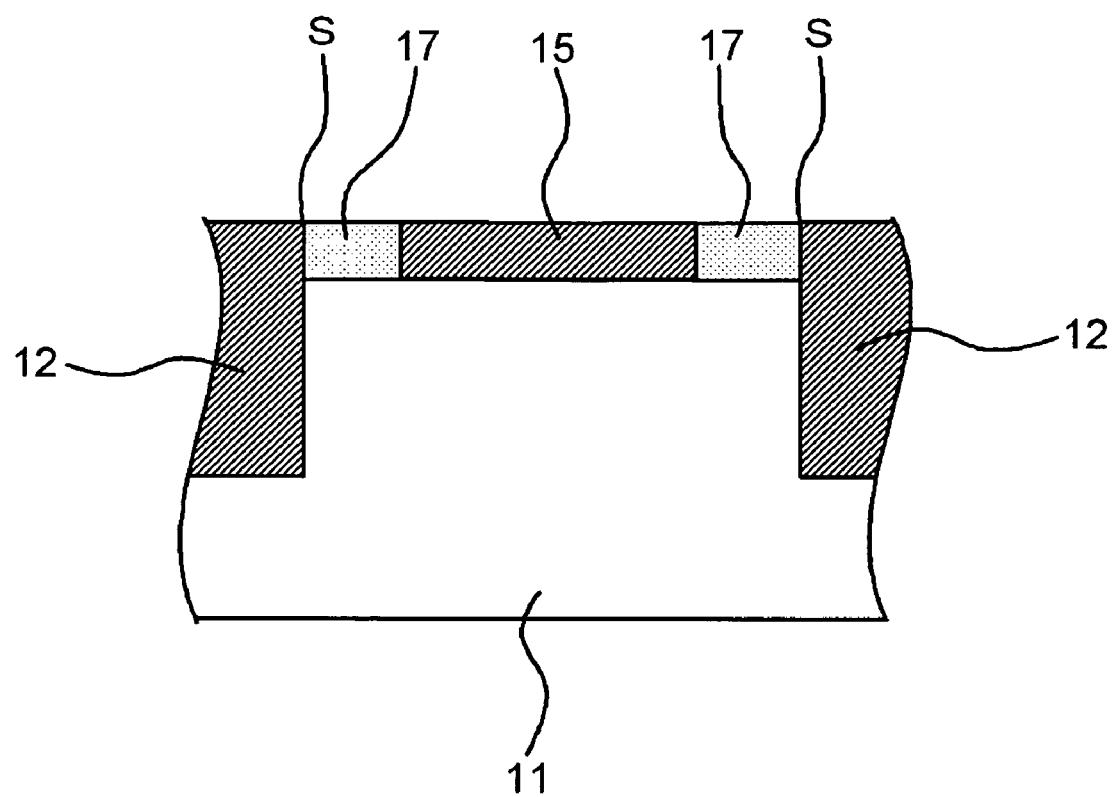
FIG. 3 is a sectional view in a III-III direction in FIG. 1.
Figure 4:
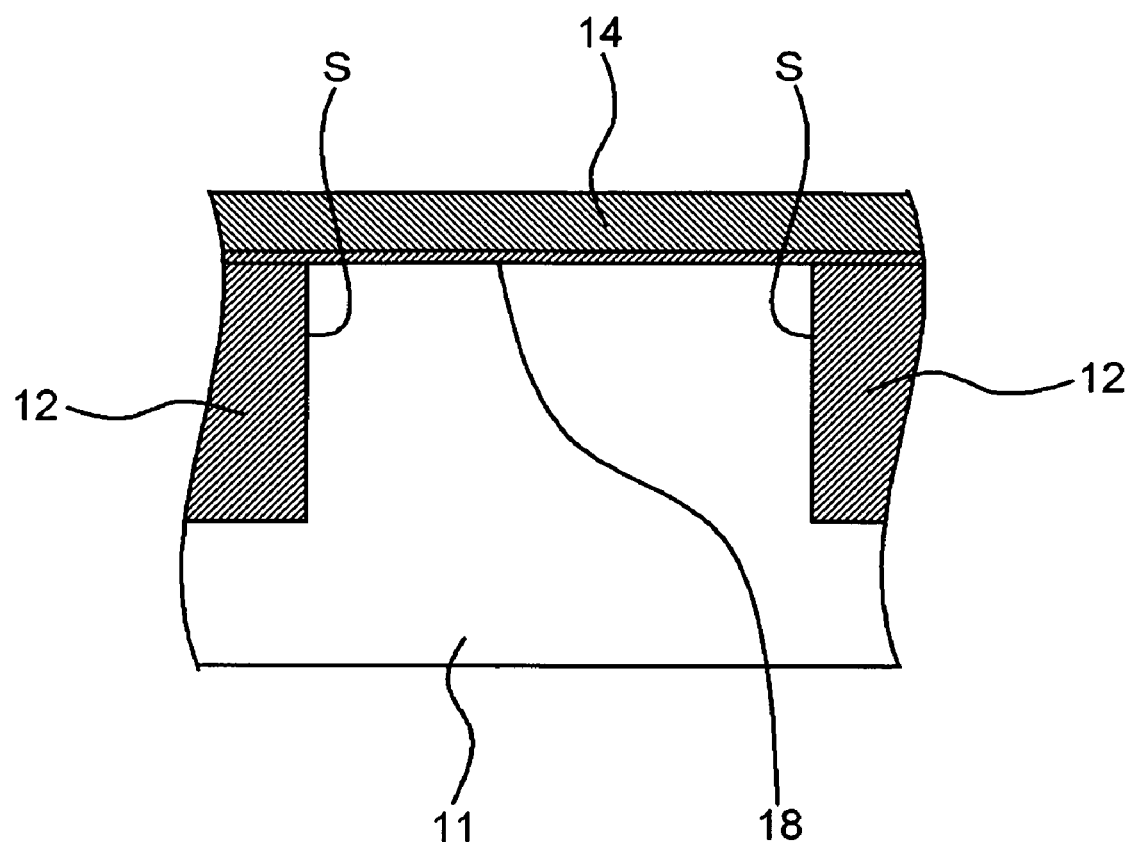
FIG. 4 is a sectional view in a IV-IV direction in FIG. 1.
Figure 5:
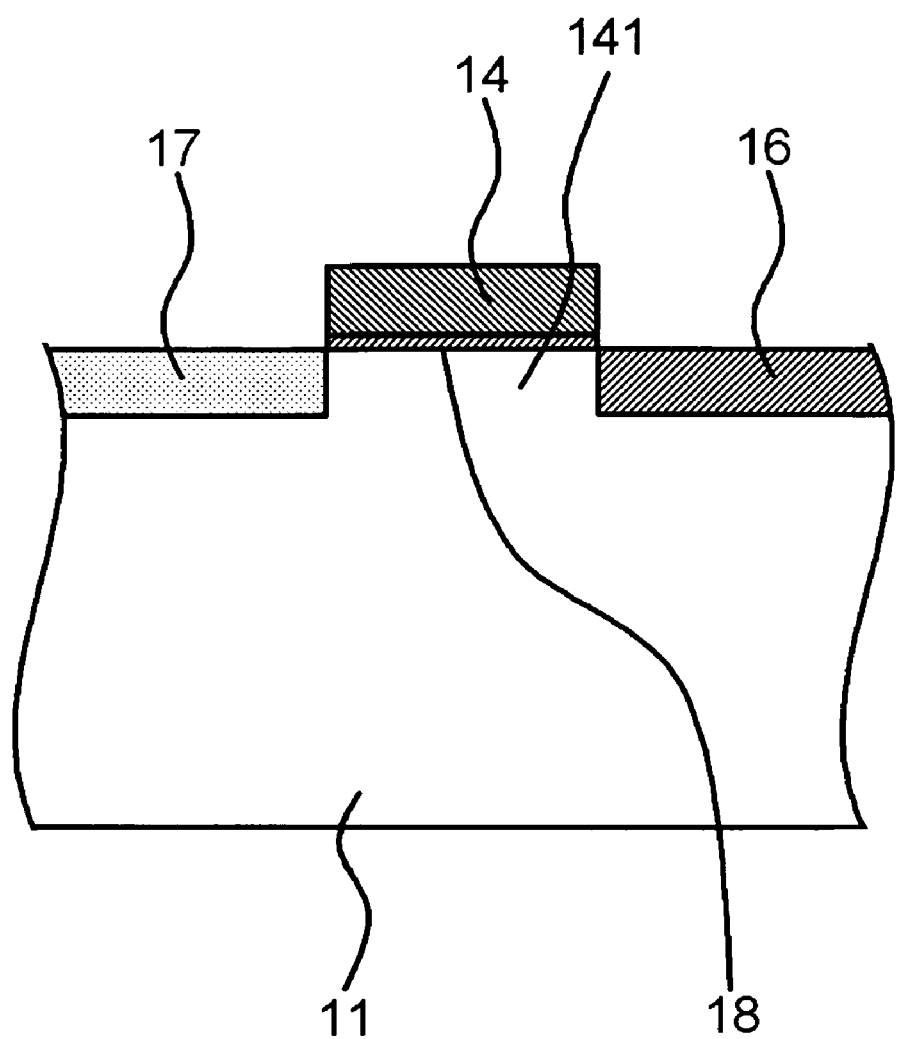
FIG. 5 is a sectional view in a V-V direction in FIG. 1.
Figure 6:
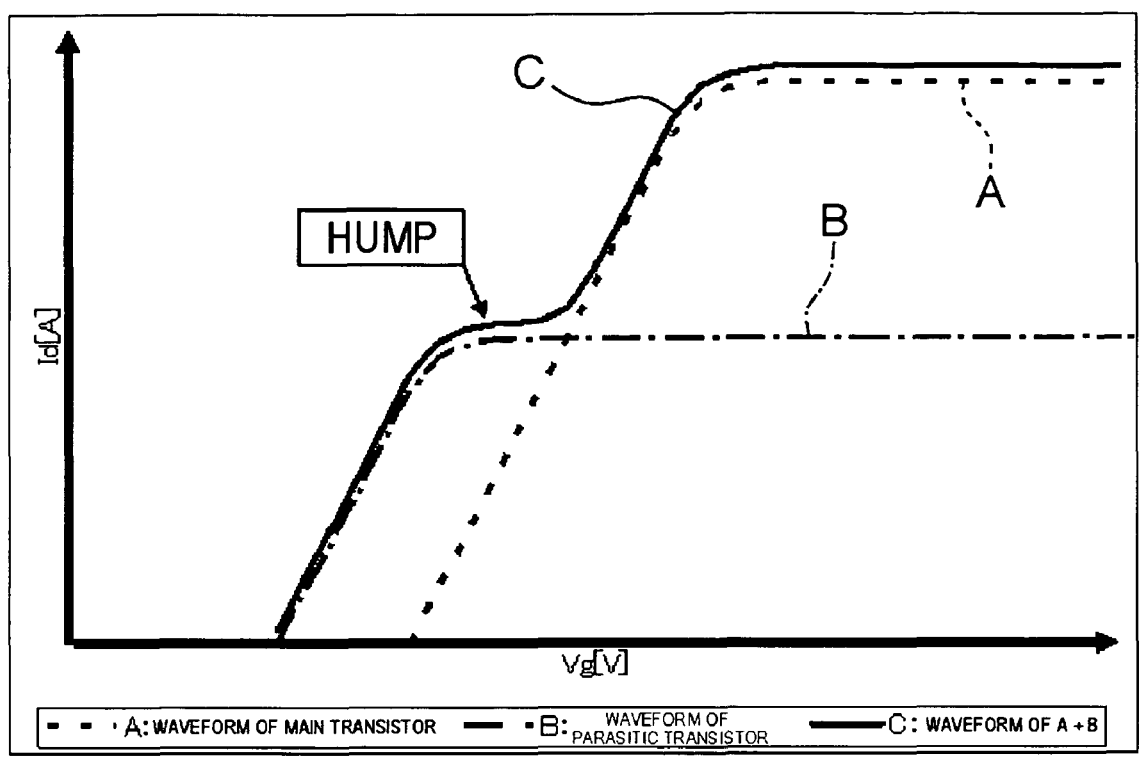
FIG. 6 is a graph showing a hump characteristic in a conventional semiconductor device.
Figure 7:
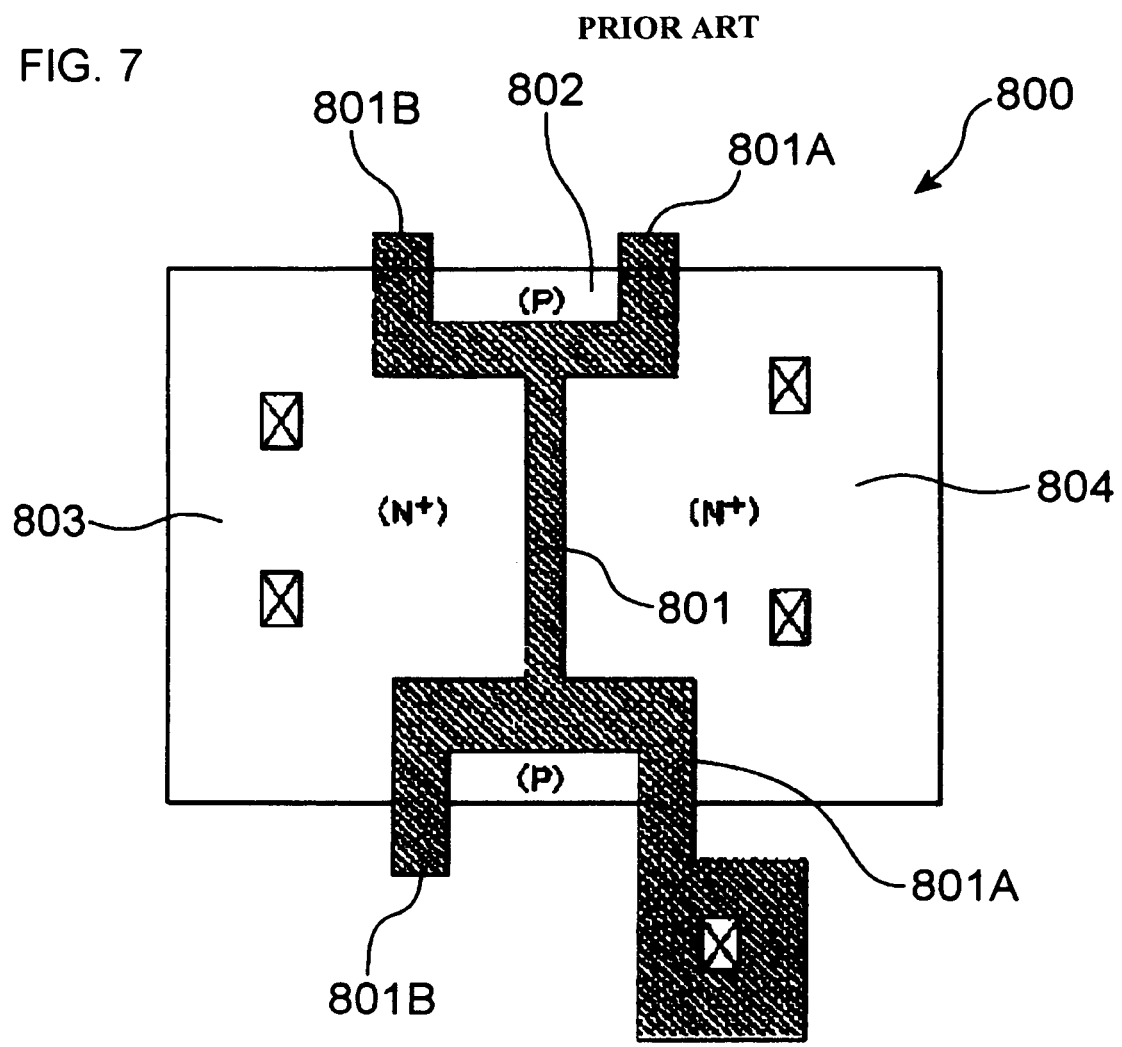
FIG. 7 is a plan view showing a conventional semiconductor device.
Figure 8:
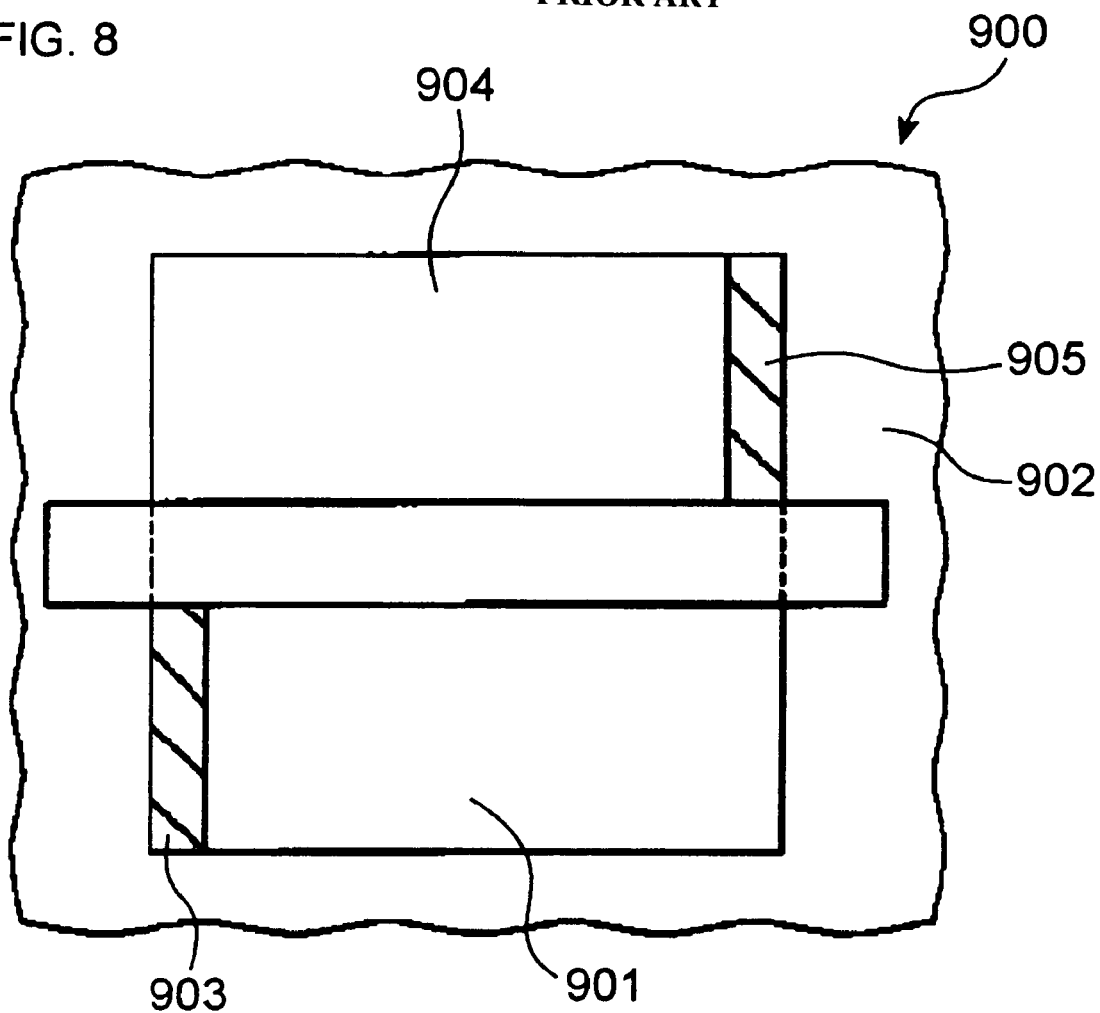
FIG. 8 is a plan view showing a conventional semiconductor device.

FIG. 1 is a plan view of a semiconductor device according to the embodiment. FIGS. 2 to 5 are sectional views of the semiconductor device. FIG. 2 is a sectional view in a II-II direction in FIG. 1, and FIG. 3 is a sectional view in III-III direction in FIG. 1. FIG. 4 is a sectional view in a IV-IV direction in FIG. 1, and FIG. 5 is a sectional view in a V-V direction in FIG. 1.

An outline of a semiconductor device 1 according to the embodiment will be described below.

The semiconductor device 1 according to the embodiment includes: an element isolation film 12 formed on a surface of a semiconductor layer (semiconductor substrate 11) of one conductivity type; a gate electrode 14 which is formed on an element forming region 13 partitioned by an element isolation film 12 and which has one pair of end portions located on a boundary between the element isolation film 12 and the element forming region 13; a source region 15 and a drain region 16 of a reverse conductivity type which are formed in the element forming region 13 and arranged to sandwich a region immediately below the gate electrode 14; and an impurity diffusion region 17 of the one conductivity type formed in the element forming region 13.

The source region 15 is arranged to be separated from a region 141 on a boundary side between the element isolation film 12 and the element forming region 13 in the region immediately below the gate electrode 14 in the element forming region 13.

In the impurity diffusion region 17 of the one conductivity type, a portion adjacent to a region 141 on the boundary side of the region immediately below the gate electrode 14 is located between the source region 15 and the element isolation film 12, and is arranged between the source region 15 and the region 141 on the boundary side so as to be in contact with the source region 15 and region 141 on the boundary side. The impurity diffusion region 17 of the one conductivity type is not arranged between the drain region 16 and the element isolation film 12.

In this case, the region 141 on the boundary side is a predetermined region which extends from a boundary between the element isolation film 12 and the element forming region 13 immediately below the gate electrode 14, in an extending direction (direction in which one pair of end portions are connected to each other), and the region 141 means an end portion of the region in the element forming region 13 in the region immediately below the gate electrode 14.

The semiconductor device 1 according to the embodiment will be described below in detail.

The semiconductor substrate 11 of the semiconductor device 1 shown in FIG. 2 is a silicon substrate of one conductivity type (p-type).

On a surface of the semiconductor substrate 11, as shown in FIGS. 1 to 5, a trench is formed by an STI technique, and the element isolation film 12 is formed so as to bury the trench.

As the element isolation film 12, for example, an SiO$_2$ film or the like is used. A region surrounded by the element isolation film 12 serves as the element forming region 13.

In the element forming region 13, the source region 15 and the drain region 16 are formed. In the embodiment, each of the source region 15 and the drain region 16 is a planar rectangular shape.

The source region 15 and the drain region 16 are n$^+$-type regions, and are formed by diffusing an impurity such as phosphorous or arsenic into the surface of the semiconductor substrate 11.

The source region 15 and the drain region 16 are arranged with a predetermined gap to place opposite each other. When the source region 15 and the drain region 16 are planarly viewed from the substrate surface side of the semiconductor substrate 11, the area of the drain region 16 is larger than the area of the source region 15.

More specifically, a width (width of the source region 15 in a longitudinal direction) along a longitudinal direction of the gate electrode 14 of the source region 15 is shorter than a width (width of the drain region 16 in a longitudinal direction) along a longitudinal direction of the gate electrode 14 of the drain region 16, and one pair of end portions of the drain region 16 in the longitudinal direction do not face the source region 15.

As shown in FIG. 2, one pair of end portions of the drain region 16 in the longitudinal direction are in contact with a boundary S between the element isolation film 12 and the element forming region 13.

A periphery of the drain region 16 is in contact with an entire length of the region immediately below the gate electrode 14 in the element forming region 13. Furthermore, in the boundary S between the element isolation film 12 and the element forming region 13, the periphery of the drain region 16 is in contact with a circumference of a part located to be closer to the drain region 16 than the gate electrode 14.

In other words, of the boundary between the element isolation film 12 and the element forming region 13, a part located closer to the drain region 16 than the gate electrode 14 is not separated from the drain region 16.

On the other hand, as shown in FIG. 3, the source region 15 is not formed in a region adjacent to the region 141 on the boundary side in the region immediately below the gate electrode 14, and one pair of end portions of the source region 15 in the longitudinal direction are separated from the element isolation film 12.

In other words, the one pair of end portions of the source region 15 in the longitudinal direction are not in contact with the boundary S between the element isolation film 12 and the element forming region 13, and the one pair of end portions of the source region 15 in the longitudinal direction face the element isolation film 12.

Furthermore, the one pair of end portions of the source region 15 in the longitudinal direction are arranged to be separated from the region 141 on the boundary side between the element isolation film 12 and the element forming region 13 in the region immediately below the gate electrode 14 in the element forming region 13. In other words, the source region 15 is separated from the boundary line between the element isolation film 12 located in the region immediately below the gate electrode 14 and the element forming region 13. Further, the source region 15 is arranged to be separated, with a predetermined gap, from the boundary line S extending from the boundary line immediately below the gate electrode 14, the boundary line S being between the element isolation film 12 protruded from the region immediately below the gate electrode 14 and the element forming region 13. In the element forming region 13, the source region 15 is formed in the region which the gate electrode 14 is not formed, which is on an opposite side of the drain region through the gate electrode 14 and which corresponds to the one pair of end portions along the extending direction of the gate electrode 14. The source region 15 is in contact with the region immediately below the gate electrode 14 except for the region 141 on the boundary side.

The gate electrode 14 is formed on a region between the drain region 16 and the source region 15. The region immediately below the gate electrode 14, the drain region 16, and the source region 15 do not overlap. The gate electrode 14 has a planar rectangular shape, and, as shown in FIG. 4, has end portions in the longitudinal direction which are located on the boundaries S between the element isolation film 12 and the element forming region 13. In the embodiment, distal ends of the end portions of the gate electrode 14 in the longitudinal direction extend to an upper side of the element isolation film 12.

The gate electrode 14 is, for example, a polysilicon film. A gate oxide film 18 is arranged between the gate electrode 14 and the surface of the semiconductor substrate 11.

An impurity is not injected into the region immediately below the gate electrode 14. The region is a p-type region.

The impurity diffusion region 17 is a region formed by injecting an impurity such as boron into the surface of the semiconductor substrate 11. In the embodiment, the impurity diffusion region 17 is a p$^+$-type region.

The impurity diffusion region 17 includes a plurality of impurity diffusion regions, more specifically, two impurity diffusion regions. The impurity diffusion regions 17 are arranged between one end portion of the source region 15 in the longitudinal direction and the element isolation film 12 and between the other end portion of the source region 15 in the longitudinal direction and the element isolation film 12, respectively.

The impurity diffusion region 17 is not arranged between the element isolation film 12 and the drain region 16.

Each of the impurity diffusion regions 17 is arranged to be in contact with the boundary S between the element isolation film 12 and the element forming region 13 in the region adjacent to the region 141 on the boundary side between the element isolation film 12 and the element forming region 13 in the region immediately below the gate electrode 14. Each of the impurity diffusion regions 17 is in contact with the region 141 on the boundary side between the element isolation film 12 and the element forming region 13 in the region immediately below the gate electrode 14 and is in contact with the end portions of the source region 15 in the longitudinal direction.

Each of the impurity diffusion regions 17 is arranged along the entire length of the end portions of the source region 15 in the longitudinal direction, and is in contact with entire surfaces of one pair of end portions of the source region 15 in the longitudinal direction, the entire surfaces facing the element isolation film 12.

Furthermore, as shown in FIG. 5, each of the impurity diffusion regions 17 face the end portions of the drain region 16 through the region immediately below the gate electrode 14.

An impurity concentration of the one conductivity type (p-type) in the impurity diffusion region 17 is higher than impurity concentrations of the reverse conductivity type (n-type) in the source region 15 and the drain region 16.

A resistance of the impurity diffusion region 17 is equal to or lower than resistances of the source region 15 and the drain region 16.

Over the source region 15 and the impurity diffusion region 17 described above, a conductor film, for example, a metal film (not shown) is formed.

Similarly, also on the drain region 16 and the gate electrode 14, although not shown, conductor films, for example, metal films are formed. A potential of the impurity diffusion region 17 is equal to potentials of the source region 15 and the semiconductor substrate 11 (substrate potentials).

A method of manufacturing the above semiconductor device 1 will be described below.

First, a trench is formed in the surface of the p-type semiconductor substrate 11 by RIE. The trench is filled with a silicon oxide film to form the element isolation film 12.

Thereafter, the gate oxide film 18 and polysilicon are formed to form the gate electrode 14.

A mask is formed on the element forming region 13 of the semiconductor substrate 11 to cover a portion on which the impurity diffusion region 17 is to be formed. Thereafter, impurity ions such as phosphorous ions or arsenic ions are injected into the surface of the semiconductor substrate 11 to form the source region 15 and the drain region 16.

The mask is removed, and a mask which covers the source region 15 and the drain region 16 is formed. Therefore, impurity ions such as boron ions are injected to form the impurity diffusion region 17.

An operational effect of the embodiment will be described below.

In the embodiment, the source region 15 is arranged to be separated from the region 141 on the boundary side between the element isolation film 12 and the element forming region 13 in the region immediately below the gate electrode 14 in the element forming region 13.

The impurity diffusion region 17 of the one conductivity type has a portion adjacent to the region 141 on the boundary side of the region immediately below the gate electrode 14, the portion being located between the source region 15 and the element isolation film 12. The impurity diffusion region 17 is in contact with the source region 15 and the region 141 on the boundary side of the region immediately below the gate electrode 14.

Therefore, by providing the impurity diffusion region 17 of the one conductivity type, the region 141 on the boundary side of the region immediately below the gate electrode 14 is not in direct contact with the source region 15. In this manner, the region 141 on the boundary side of the region immediately below the gate electrode 14 can be prevented from being a channel region to make it possible to suppress parasitic transistor generation. Accordingly, a hump characteristic occurring can be suppressed.

In this manner, in the embodiment, the impurity diffusion region 17 of one conductivity type may be arranged between the source region 15 and the element isolation film 12 in the region adjacent to the region 141 on the boundary side of the region immediately below the gate electrode 14 and arranged to be in contact with the source region 15 and the region 141 on the boundary side of the region immediately below the gate electrode 14. Unlike in the technique of JP-A No. 2004-288873, the impurity diffusion region of the one conductivity type need not be arranged between the divided end portions of the gate electrode. For this reason, the shape of the gate electrode can be prevented from being complicated.

In the embodiment, the impurity diffusion region 17 is arranged between the source region 15 and the element isolation film 12, and is not arranged between the drain region 16 and the element isolation film 12.

When the impurity diffusion region is formed between the drain region 16 and the element isolation film 12, a contact metal film is formed over the impurity diffusion region and the drain region 16. For this reason, the potential of the drain region 16 is equal to the potential of the impurity diffusion region. Since the potential of the drain region 16 and a substrate potential are different from each other, a leak current is disadvantageously generated between the impurity diffusion region and the semiconductor substrate 11.

It is possible not to form the metal film on the impurity diffusion region. However, when the metal film is to be formed, a mask which covers the impurity diffusion region 17 needs to be formed, and thereby making semiconductor device manufacturing complicate.

In contrast to this, in the embodiment, the impurity diffusion region 17 is arranged between the source region 15 and the element isolation film 12. When a contact metal film is formed over the impurity diffusion region 17 and the source region 15, the impurity diffusion region 17 has the same potential as that of the source region 15. In the embodiment, the source region 15 has the same potential (substrate potential) as that of the semiconductor substrate 11. For this reason, a leak current can be prevented from being generated between the impurity diffusion region 17 and the semiconductor substrate 11.

In the embodiment, the impurity diffusion region 17 is formed between the source region 15 and the element isolation film 12. The impurity diffusion region 17 has a resistance which is equal to or lower than that of the source region 15.

In this manner, when the impurity diffusion region 17 having a low resistance is formed, a substrate potential can be obtained through the impurity diffusion region 17.

In the conventional technique, a $p^+$-type region (body region) to obtain the substrate potential is formed in a region adjacent to the source region 15. However, the impurity diffusion region 17 is formed to make a body region unnecessary. In this manner, an area of the element forming region can be reduced.

In the embodiment, the impurity diffusion region 17 is formed along an entire length of the end portions of the source region 15 in the longitudinal direction. The impurity diffusion region 17 is arranged to be in contact with the entire surfaces of one pair of end portions of the source region 15 in the longitudinal direction, the entire surfaces facing the element isolation film 12.

The impurity diffusion region 17 is thus formed to make it possible to reliably suppress hump characteristic occurring.

The present invention is not limited to the embodiment described above. Changes and modifications are included in the present invention without departing from the spirit and the scope of the invention.

For example, in the embodiment, although the source region 15, the drain region 16, and the impurity diffusion region 17 are formed on the surface of the p-type semiconductor substrate 11. The present invention is not limited to the configuration. For example, a p-type well may be formed on a surface of an n-type semiconductor substrate, and the source region 15, the drain region 16, and the impurity diffusion region 17 may be formed in a p-type well.

Furthermore, the semiconductor substrate 11 may be an SOI substrate or the like.

In the embodiment, the impurity diffusion region 17 is a $p^+$-type region. However, the impurity diffusion region 17 is not limited to the region. For example, a $p^-$-type region may be used.

Furthermore, in the embodiment, the semiconductor substrate 11 is a p-type substrate, the source region 15 and the drain region 16 are $n^+$-type regions, and the impurity diffusion region 17 is a $p^+$-type region. However, the present invention is not limited to the configuration. The semiconductor substrate may be of an n-type, the source region 15 and the drain region 16 may be of a p$^+$-type, and the impurity diffusion region 17 may be of an n$^+$-type.

Furthermore, in the embodiment, the impurity diffusion region 17 is arranged along an entire length of the end portions of the source region 15 in the longitudinal direction. However, the present invention is not limited to the configuration. The impurity diffusion region 17 may be in contact with only the region 141 on the boundary side of the region immediately below the gate electrode 14, and may have a length shorter than a length of the end portions of the source region 15 in the longitudinal direction.

It is apparent that the present invention is not limited to the above embodiment, and may be modified and changed without departing from the scope and spirit of the invention.

What is claimed is:

1. A semiconductor device comprising:
   an element isolation film formed on a semiconductor layer surface of one conductivity type;
   a gate electrode which is arranged on an element forming region partitioned by said element isolation film and which has one pair of end portions located on a boundary between said element isolation film and said element forming region;
   a source region and a drain region of a reverse conductivity type formed in said element forming region and arranged to sandwich a region immediately below said gate electrode; and
   an impurity diffusion region of said one conductivity type formed in said element forming region, wherein
   said source region is arranged to be separated from a region on a boundary side between said element isolation region and said element forming region in the region immediately below said gate electrode in said element forming region,
   said impurity diffusion region of said one conductivity type is in contact with said source region and said region on said boundary side of the region immediately below said gate electrode,
   a portion adjacent to said region on said boundary side is located between said source region and said element isolation film, and
   said impurity diffusion region of said one conductivity type is not arranged between said drain region and said element isolation film.

2. The semiconductor device according to claim 1, wherein a peripheral portion of the drain region is in contact with an entire length of a portion, which is closer to said drain region than said gate electrode, of a boundary between said element isolation film and said element forming region and
   an entire length of a region immediately below said gate electrode in said element forming region.

3. The semiconductor device according to claim 1, wherein a potential of said impurity diffusion region of said one conductivity type is equal to a potential of said semiconductor layer.

4. The semiconductor device according to claim 1, wherein an impurity concentration of one conductivity type in said impurity diffusion region of said one conductivity type is not less than an impurity concentration of said reverse conductivity type in said source region.

5. The semiconductor device according to claim 1, wherein a resistance of said impurity diffusion region of said one conductivity type is not more than a resistance of said source region.

6. The semiconductor device according to claim 1, wherein said source region has one pair of end portions which are arranged to be separated from said region on the boundary side in said region immediately below said gate electrode,
   said source region is not formed in a region adjacent to said region on said boundary side, each of said end portions of said source region are separated from said element isolation films, and
   said impurity diffusion region of said one conductivity type is in contact with said region on said boundary side of said region immediately under said gate electrode, and is formed to be in contact with entire surfaces of said one pair of end portions of said source region, said entire surfaces facing said element isolation film.

* * * * *